United States Patent [19]

Gorshe

[11] Patent Number: 5,537,632
[45] Date of Patent: Jul. 16, 1996

[54] METHOD AND SYSTEM FOR FAULT COVERAGE TESTING MEMORY

[75] Inventor: Steven S. Gorshe, Beaverton, Oreg.

[73] Assignee: NEC America, Melville, N.Y.

[21] Appl. No.: 376,447

[22] Filed: Jan. 23, 1995

Related U.S. Application Data

[63] Continuation of Ser. No. 691,780, Apr. 26, 1991, abandoned.

[51] Int. Cl.$^6$ ................................................. G11C 29/00
[52] U.S. Cl. ......................................................... 395/183.18
[58] Field of Search ........................ 371/21.1, 21.2, 371/21.3, 21.5, 21.6, 22.4, 25.1; 365/200, 201; 395/183.18

[56] References Cited

U.S. PATENT DOCUMENTS

| | | | |
|---|---|---|---|
| 3,751,649 | 8/1973 | Hart, Jr. ................................. | 235/153 |
| 4,061,908 | 12/1977 | de Jonge et al. ....................... | 235/302.3 |
| 4,332,028 | 5/1982 | Joccotton et al. ..................... | 371/21 |
| 4,335,457 | 6/1982 | Early ..................................... | 371/28 |
| 4,363,124 | 12/1982 | Aichelmann, Jr. ..................... | 371/21 |
| 4,414,665 | 11/1983 | Kimura et al. ......................... | 371/21 |
| 4,450,560 | 5/1984 | Conner .................................. | 371/25 |
| 4,485,435 | 11/1984 | Sibley ................................... | 364/200 |
| 4,601,033 | 7/1986 | Whelan .................................. | 371/25 |
| 4,680,761 | 7/1987 | Burkness ............................... | 371/25 |
| 4,712,216 | 12/1987 | Glaise ................................... | 371/38 |
| 4,715,034 | 12/1987 | Jacobson .............................. | 371/21 |
| 4,726,023 | 2/1988 | Carter et al. .......................... | 371/15 |
| 4,751,636 | 6/1988 | Sibley ................................... | 364/200 |
| 4,757,503 | 7/1988 | Hayes et al. .......................... | 371/21 |
| 4,782,487 | 11/1988 | Smelser ................................ | 371/21 |
| 4,872,168 | 10/1989 | Aadsan et al. ....................... | 371/21.3 |
| 4,873,686 | 10/1989 | Tada et al. ........................... | 371/22.4 |
| 4,878,174 | 10/1989 | Watkins et al. ....................... | 364/200 |
| 4,912,395 | 3/1990 | Sato et al. ............................ | 571/21.2 |
| 4,918,378 | 4/1990 | Katircioglu et al. .................. | 365/200 |
| 4,972,418 | 11/1990 | Chou .................................... | 371/21.2 |
| 5,033,048 | 7/1991 | Pierce et al. ......................... | 371/21.2 |
| 5,091,908 | 2/1992 | Zorian .................................. | 371/21.5 |

OTHER PUBLICATIONS

You et al., "A Self–Testing Dynamic RAM Chip", Journal of Solid–State Circutis, vol. sc–20, No. 1 Feb. 1985, pp. 428–435.

Srini, "Fault Location in a Semiconductor Random–Access Memory Unit", Transactions on Computers, vol. c–27, No. 4, Apr. 1978, pp. 349–358.

Papachristou et al., "An Improved Method for Detecting Functional Faults in Semiconductor Random Access Memories", Transactions on Computers, vol. c–34 No. 2, Feb. 1985 pp. 110–116.

Suk et al., "A March Test for Functional Faults in Semiconductor Random Access Memories", Transactions on Computers, vol. c–30 No. 12, Dec. 1981, pp. 982–985.

Nair et al., "Efficient Algorithms for Testing Semiconductor Random–Access Memories", Transactions on Computers, vol. c–27, No. 6, Jun. 1978 pp. 572–576.

(List continued on next page.)

*Primary Examiner*—obert W. Beausoliel, Jr.
*Assistant Examiner*—Norman M. Wright
*Attorney, Agent, or Firm*—Sughrue, Mion, Zinn, Macpeak & Seas

[57] ABSTRACT

A method for fault coverage testing an integrated circuit having a memory device with word locations, including the steps of setting test data to an initial value, dependently making the test data unique for each of the word locations, and automatically, dependently testing each bit of each of the word locations for a fault using the unique test data which corresponds to the word location being tested. Alternatively, the method may include the steps of inverting a bit of test data, writing the test data to a current word location of the memory device, reading test data from the current word location of the memory device, rotating the test data read by one bit position, repeating the writing, reading and rotating a predetermined number of times for each of the word locations, and comparing the test data read from a last word location of the memory device with a predetermined value. A system for performing the fault coverage testing method is also disclosed.

33 Claims, 11 Drawing Sheets

OTHER PUBLICATIONS

Knaizuk et al., "An Optimal Algorithm for Testing Stuck-at Faults in Random Access Memories", Transactions on Computers, vol. c–26 No. 11, Nov. 1977 pp. 1141–1144.

Hayes, "Testing Memories for Single-Cell Pattern-Sensitive Faults", Transactions on Computers, vol. c–29, No. 3, Mar. 1980 pp. 249–254.

Franklin et al., "A Built–In Self–Test Algorithm for Row/Column Pattern Sensitive Faults in RAM's", Journal of Solid–State Circuits, vol. 25, No. 2, Apr. 1990 pp. 514–523.

Kinoshita et al., "Built–In Testing of Memory Using an On–Chip Compact Testing Scheme", Transactions on Computers, vol. c–35, No. 10 Oct. 1986 pp. 862–870.

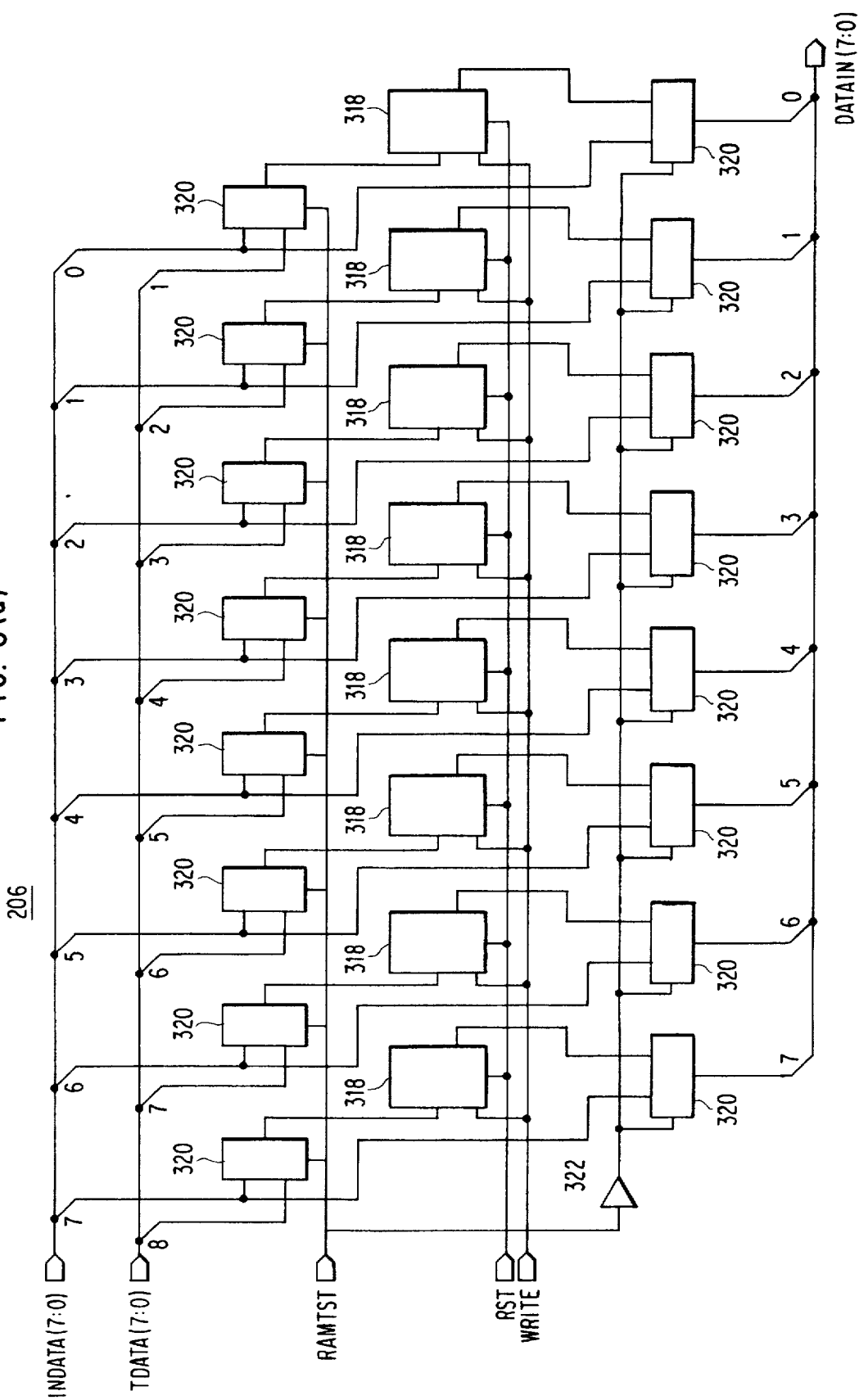

METHOD AND SYSTEM FOR FAULT COVERAGE TESTING MEMORY

This is a continuation of application Ser. No. 07/691,780 filed Apr. 26, 1991, now abandoned.

BACKGROUND OF THE INVENTION

1. Field of the Invention

The present invention relates to a fault coverage testing technique, and more particularly, to a method and system for testing a memory of an integrated circuit for faults.

2. Description of the Related Art

Memory cells of memory devices have been tested using many different techniques. Memory devices include, for example, commercial memory chips and VLSI designs having memory. VLSI designs include, for example, application specific integrated circuits (ASIC) which often include a random access memory (RAM).

Memory devices can be tested using internal or external means. External testing is typically performed by manufacturers of commercial memory chips. Although external testing is thorough; it requires the generation of many test vectors to obtain sufficient fault coverage. Test vectors are external stimulants which are supplied to test the memory. The more test vectors required the more inefficient the testing. Functional testing is another external testing technique which has been previously used, but it requires an understanding of the functionality of the circuit. Thus, in general, external testing is very time consuming.

Internal testing has been used to test a memory, but it often does not provide sufficient fault coverage. One major disadvantage of conventional internal testing is that a large amount of additional gates must be added to the integrated circuit. This reduces the available space on the integrated circuit for other circuitry or increases the chip area dedicated to the memory and its associated circuitry. In some commercial memory devices, additional test circuits are added which while being efficient, are not available for use on ASICs.

In sum, prior techniques for testing memory typically require complicated circuitry and large quantities of test vectors. For example, conventionally, when testing a memory, at least four test vectors are supplied to test each bit, two read clocks and two write clocks. Numerous additional test vectors are conventionally thereafter required to test elements of the integrated circuit, such as, address lines, address decoder, data lines, data buffer, etc. which are associated with the memory. Therefore, prior techniques inefficiently use test vectors or additional circuitry to obtain fault coverage. The more test vectors utilized, the more complicated the testing circuitry becomes.

SUMMARY OF THE INVENTION

Accordingly, it is an object of the present invention to provide a memory testing system which provides virtually complete fault coverage using minimal additional circuitry.

It is another object of the present invention to provide a method and system for testing a memory of an integrated circuit in which only a minimal number of test vectors are required to test the memory.

It is yet another object of the present invention to provide a self-testing system which automatically tests a memory and associated circuitry for faults.

It is a further object to provide a method for providing virtually complete fault coverage testing for a memory with a high degree of fault location capability.

According to an embodiment of the present invention, a method for fault testing an integrated circuit having at least a memory with a plurality of word locations includes the steps of setting test data to an initial value, dependently making the test data unique for each of the word locations, and automatically, dependently testing each bit of each of the word locations for a fault using the unique test data which corresponds to the word location being tested.

According to another embodiment of the present invention, a method for fault coverage testing an integrated circuit including a memory having word locations, includes the steps of inverting a bit of test data, writing the test data to a current word location of the memory, reading test data from the current word location of the memory, rotating the test data read by one bit position, repeating the writing, reading and rotating a predetermined number of times for each of the word locations, and comparing the test data read from a last word location of the memory with a predetermined value.

The present invention also includes a system for performing fault coverage testing, the system includes a memory to be tested and a control unit for controlling operations of the system to perform the above-described method.

BRIEF DESCRIPTION OF THE DRAWINGS

The invention will be more clearly understood from the following description in conjunction with the accompanying drawings, wherein:

FIGS. 5(a)–5(g) are block diagrams illustrating a detailed example of a system according to the present invention.

DETAILED DESCRIPTION OF THE PREFERRED EMBODIMENTS

The present invention provides a fault testing method and system which is both time and circuitry efficient. The method requires only one test vector per bit to test the memory with almost complete fault coverage. The reduction in the number of test vectors leads to an increase in speed over conventional methods. Further, the system is simplified and requires few additional gates beyond those already present on an integrated circuit with a memory.

The present invention tests not only the memory itself, but also the circuitry associated with the memory. For example, circuitry associated with the memory typically includes a data bus, a data buffer, data lines, address buffer, address decoder, address lines, select lines and enable lines.

The memory is tested word by word using circuitry, such as, an address decoder, address lines, select lines and enable lines which are conventional. Test data, like other data, is supplied to the memory using a data bus, a data buffer and data lines which are also conventional. As a result, the present invention is able to test the circuitry associated with the memory while the memory is tested. Further, by design, the circuitry associated with the memory needs only minimal modifications to efficiently perform the operations of the present invention, which minimizes the number of additional gates required on the integrated circuit simply for testing.

The integrated circuit which includes the memory being tested is operable in either a normal mode or a test mode. In the normal mode, the integrated circuit functions normally as if the test circuitry is nonexistent. On the other hand, in the test mode, the integrated circuit operates to test the memory and associated circuitry for faults as described below. Several types of faults are detected by the present invention, namely, stuck high lines and bits, stuck low lines and bits, lines stuck together, and disconnected lines. These faults can occur in either the memory or its associated circuitry.

The fault coverage testing method of the present invention is described below with reference to FIGS. 1, 2(a), 2(b), 3(a) and 3(b), which are flow charts illustrating the operation of the method.

Figure 1:
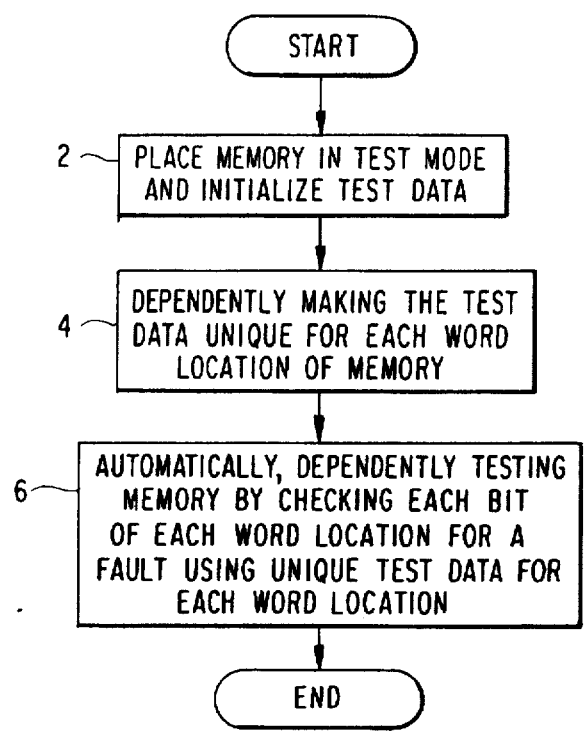
FIG. 1 is a flow chart illustrating basic principles of the present invention.

FIG. 1 is a flow chart illustrating basic principles of the present invention. The present invention utilizes test data which is sequentially dependent on initial test data. Further, each word location of the memory is tested using unique test data. Namely, the test data from the current word location is used to produce the unique data for the next word location in a predetermined manner.

The method begins by placing the memory in a test mode and initializing test data to a predetermined value (step 2). Next, test data is dependently made unique for each word location of the memory (step 4). This makes the test data stored to each word location unique to the test data used for the other word locations. Further, the test data is made unique for each word location in a sequentially dependent manner. As a result, the test data finally output by each of the word locations is not only unique in a predetermined manner, but also dependent on all preceding word locations. Hence, since the test data is made unique in a predetermined manner, the method only requires input of the initial test data value, after that the testing is automatically performed. The unique value of the test data for the next word location will depend on the test data finally output from the current word location.

For example, an initial test data $01_{HEX}$ may be stored in word location "0" an initial word location Provided no faults exist in word location "0" and the associated circuitry, then the test data finally output from word location "0" is $01_{HEX}$ which is the same as the test data initially stored. The method uses the test data finally output from a current word location to determine the unique test data for the next word location. That is, the unique test data for word location "1" is dependent on the test data finally output from the word location "0". Further, the test data finally output from a current word location is altered in a predetermined manner to make unique test data for a next word location. After the testing, the test data finally output from the word locations of the memory should be unique, provided no faults exist, and should correspond to the test data initially stored.

Thereafter, each bit of each word location is dependently tested using the unique test data for each word location (step 6). The testing is performed automatically because only the initial test data and a clock signal are needed.

As a result, only the last memory location need be checked to determine whether it contains a predetermined final unique value. If the last memory location does contain the predetermined final unique value, then the memory and the associated circuitry are not faulty. On the other hand, if the last memory location does not contain the predetermined final value, then one or more faults exist somewhere in the memory or associated circuitry. Typically, the integrated circuit is discarded if a fault is found to exist.

Optionally, the location of the faults can be determined by analyzing the test data finally output by each of the word locations of the memory. Since the initial test data and the predetermined manner of dependently making the test data unique for each of the word locations are known, the test data finally output from each of the word locations is also known. Thus, if the last word location does not contain the predetermined final value, then the location of the faults within the memory or associated circuitry can be determined using an external processor.

Figure 2B:
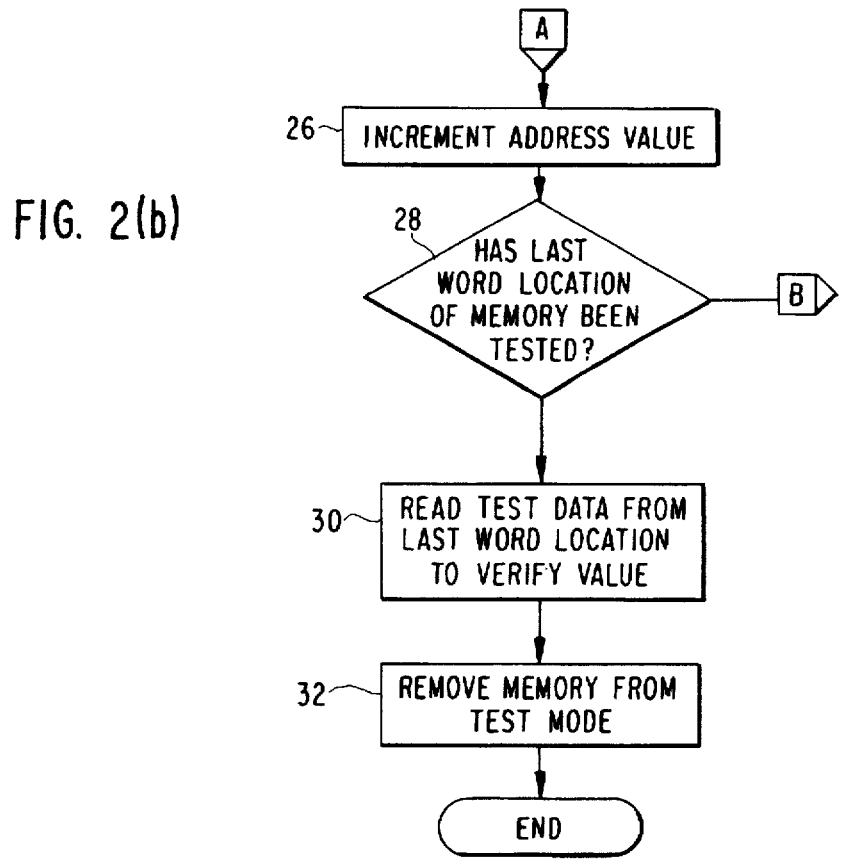
FIGS. 2(a) and 2(b) are flow charts illustrating a first embodiment of the present invention.
Figure 2A:
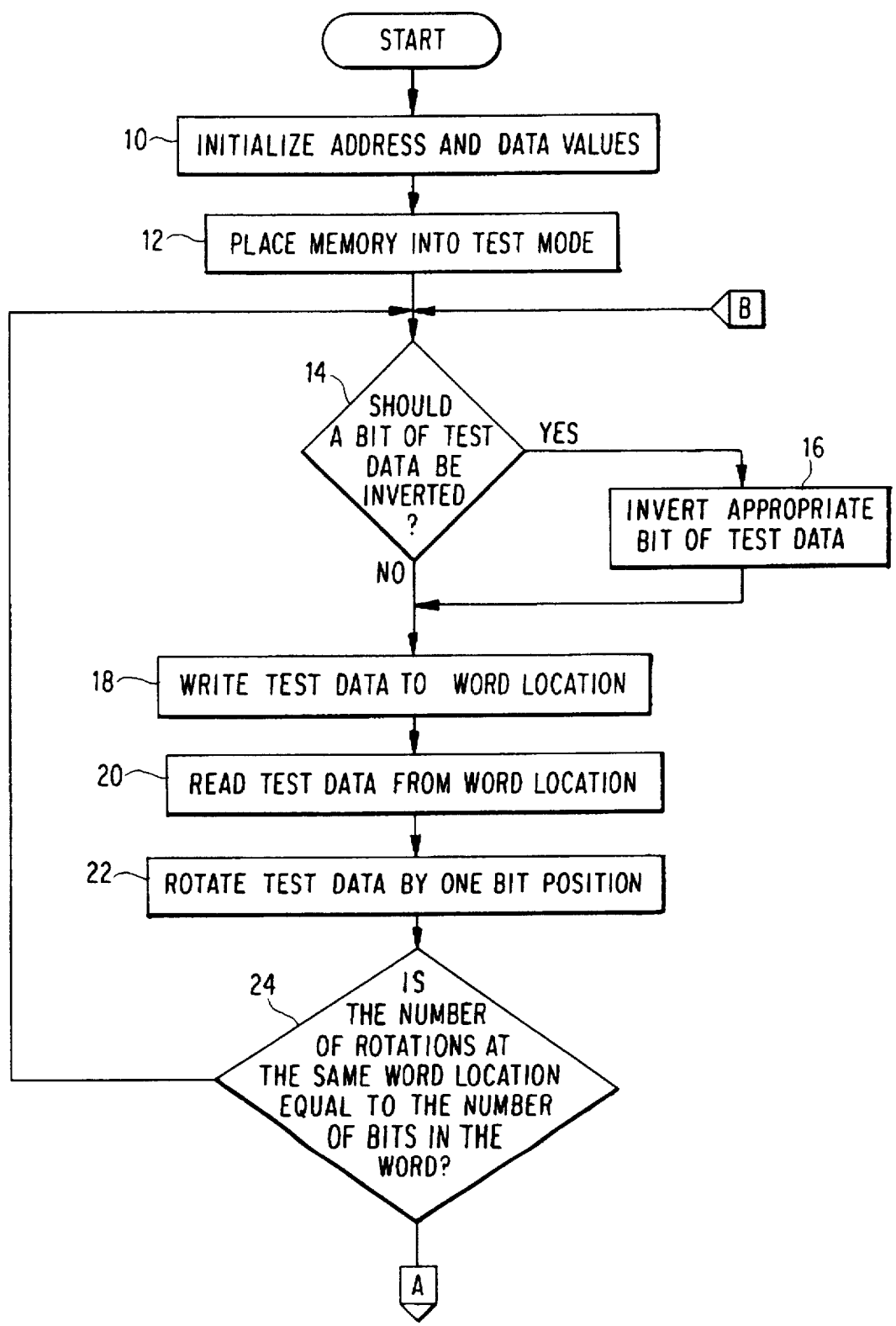

FIGS. 2(a) and 2(b) are flow charts illustrating a first embodiment of the fault coverage testing method. A detailed description of the operation of the first embodiment follows.

First, address and data values are initialized (step 10). For example, the address value can be initialized to a beginning word location of the memory such as "0" and a data value can be initialized to contain initial test data such as $01_{HEX}$. Next, the memory is placed into a test mode (step 12). This is achieved by an input signal to the chip. However, alternatively, this could also be achieved by writing to an additional register that is excluded from the test.

Next, the method determines whether or not it is time to invert a bit of the test data (step 14). The basic principal is that a single bit of the test data is inverted one time during the testing of each of the word locations in the memory. Typically, the timing of the inversion is on the first writing of the test data to each word location in the memory. In any event, the determination will become more apparent below as the invention is further described.

If it is determined that it is time to invert a bit, an appropriate bit of test data is inverted (step 16). The present invention uses several principals in determining the appropriate bit of the test data to be inverted. The several principals are: First, the same bit cannot be inverted in consecutive word locations. Second, each of the bits in the word are inverted an odd number of times. Third, the test data cannot be all "1"s or all "0"s. In addition, for better fault coverage, a fourth principal may be used wherein each of the bits in the word are inverted at least once during testing of the memory. As a result, each of the word locations in the memory receive test data which is unique to the test data received by all other word locations. Note, steps 14 and 16 correspond to step 4 of FIG. 1 wherein unique test data is dependently made unique for each of the word locations. Note also that each word can only have a unique value if the number of word locations is less than $2^{(number\ of\ bits\ in\ a\ word)}-2$. Otherwise, some word locations will use the same test data value. In these cases, the word locations which use the same value should have addresses that differ in as many bit values as possible.

Once the test data is ready to be written to the memory, whether the inversion operation in step 16 has been performed or not, the test data is written to a word location (step 18). Normally, the word locations are sequentially accessed from the initial word location to the last word location. After the test data has been written to the word location, the test data is then read back from the same word location (step 20). The test data is then rotated by one bit position (step 22). Steps 18–24 correspond to step 6 of FIG. 1.

Table 1 provides an example of the test data stored in the word location and the rotations and inversions performed for several of the word locations. Note, Table 1 assumes that (i)

the data value is initialized to the value $01_{HEX}$ as shown in row a and (ii) the seventh bit, the sixth bit and the second bit of the test data is inverted during the first write to word location "0", "1" and "2" respectively. More particularly, row a shows test data $81_{HEX}$ written in word location "0" (step 18). The test data $81_{HEX}$ is produced by inverting the seventh bit in the initial test data $01_{HEX}$ (step 16). Assuming that the memory under test does not contain a fault, when the test data is almost immediately thereafter read from the word location "0" the value $81_{HEX}$ is obtained (step 20), which is the same value that was written in step 18.

TABLE 1

TEST DATA (READ/WRITE)

| | 7 | 6 | 5 | 4 | 3 | 2 | 1 | 0 | Bit Position Word location 0 |
|---|---|---|---|---|---|---|---|---|---|
| a | 1 | 0 | 0 | 0 | 0 | 0 | 0 | 1 | - invert bit 7 |
| b | 1 | 1 | 0 | 0 | 0 | 0 | 0 | 0 | - 1st rotation |
| c | 0 | 1 | 1 | 0 | 0 | 0 | 0 | 0 | - 2nd rotation |
| d | 0 | 0 | 1 | 1 | 0 | 0 | 0 | 0 | - 3rd rotation |
| e | 0 | 0 | 0 | 1 | 1 | 0 | 0 | 0 | - 4th rotation |
| f | 0 | 0 | 0 | 0 | 1 | 1 | 0 | 0 | - 5th rotation |
| g | 0 | 0 | 0 | 0 | 0 | 1 | 1 | 0 | - 6th rotation |
| h | 0 | 0 | 0 | 0 | 0 | 0 | 1 | 1 | - 7th rotation (final) |
| i | 1 | 1 | 0 | 0 | 0 | 0 | 0 | 1 | Word location 1 - 1st rotation & invert bit 6 |
| . | . |  |  |  |  |  |  |  | . |
| j | 1 | 0 | 0 | 0 | 0 | 1 | 1 | 1 | Word location 2 (final) |

Next, it is determined whether the number of rotations at the same word location is equal to the number of bits in the test data (step 24). For example, if the test data is eight bit word, then eight rotations will be performed. When the number of rotations is not equal to the number of bits in the test data, then the processing returns to step 14. Hence, step 24 insures that the test data will be completely rotated through each of the word locations. The rotations for word location "0" are illustrated in rows a–h of Table 1. As previously discussed, following each rotation corresponding to rows b–h, the writing and reading of the test data to/from the same word location are repeated without any inverting of bits. This follows from step 14 which causes step 16 to invert a bit of the test data only once for each word location, namely during the initial write operation to a particular word location in the memory.

After the test data corresponding to the seventh rotation has been written, read and again rotated (i.e., eighth rotation), step 24 determines that the number of rotations equals the number of bits in the test data and, therefore, increments the address value such that it corresponds to the next word location (step 26). Then, it is determined whether the last word location of the memory has been tested (step 28).

When the last word location has not been tested, processing returns to step 14 to repeat the writing, reading and rotating operations for the next word location. If the last word location has been tested, the test data from the last word location is read (step 30).

Table 1 row h illustrates the test data finally output from word location "0", and row i illustrates the test data which is first stored in word location "1" after bit 6 has been inverted (step 16). Note that only bits 0, 6 and 7 are ones. Bits 0 and 7 remain ones because there were no faults and row a indicates they were ones for the current word location. The test data initially written to the next word location is the test data finally output from the current word location rotated by one additional bit position (steps 20 and 22). The inversion process of step 16 is performed for the next word location using the test data finally output from the current word location rotated by one bit position. For example reading $03_{HEX}$ as the test data finally output from word location "0" (Table 1, row h), then rotating one bit position yields $81_{HEX}$, and finally inverting bit six produces $C1_{HEX}$ (Table 1, row i). Bit 6 is a one because it is inverted in step 16 prior to being initially written to word location "1".

Thereafter, the write, read and rotate operations for the word location "1" will continue until the test data has been completely rotated through the word location. Then, the address value will be again incremented (step 26), and it will be determined whether the last word location has been tested (step 28).

When it is determined that the last word location of the memory has been tested, then the test data read from the last word location will be read to verify its value (step 30). That is, the test data read from the last word location will contain a predetermined value, provided no faults exist. If the test data read from the last word location does not coincide with the predetermined value, then the integrated circuit under test is defective.

Thereafter, the memory is removed from the test mode (step 32), thus completing the testing of the memory. The integrated circuit is then either deemed "good" or "bad". If the integrated circuit is "bad", it is typically discarded; however, the location of the faults within the memory or associated circuitry may be determined as noted above.

The testing provided by the present invention tests each word location of the memory under test as well as the associated circuitry of the memory which will become more apparent below as the system for performing the present invention is described. Each word location ends up with a unique final value.

Thus, the present invention tests all the bits of each word location for faults. At the same time, due to the inversion scheme, the addressing circuitry for the memory is tested because each word location can be processed only once, else the value stored therein is corrupted. If any of the word locations are corrupted, i.e., do not have their unique value after being tested, then the test data of the last word location will also be corrupted. This dependency in test data allows the testing in step 30 of only the last word location. It also allows the number of test vectors to be reduced and the speed of the test to increase.

If the value in the last word location is not the predetermined unique value it should be, the test data finally output from the other word locations can be checked against their predetermined unique values. For example, beginning with word location "0", one would check the test data finally output with the corresponding predetermined unique value. Since the inversion scheme is predetermined, the expected test data finally output from a next location can easily be computed, even if the test data finally output from the immediately preceding word location is not as expected. That is, one can always check the word locations themselves because the expected test data finally output by a word location can be recomputed using the test data finally output by the immediately preceding word location. The faults can then be pinpointed by analysis of the test data finally output from the word locations using an external processor. For example, if all of the word locations contain all "1"s then the data input buffer has one or more stuck high bits. As another example, if half of the word locations contain random data (from start-up) and the other half contains unexpected values, then one of the address lines is stuck somewhere in the addressing circuitry.

Figure 3A:
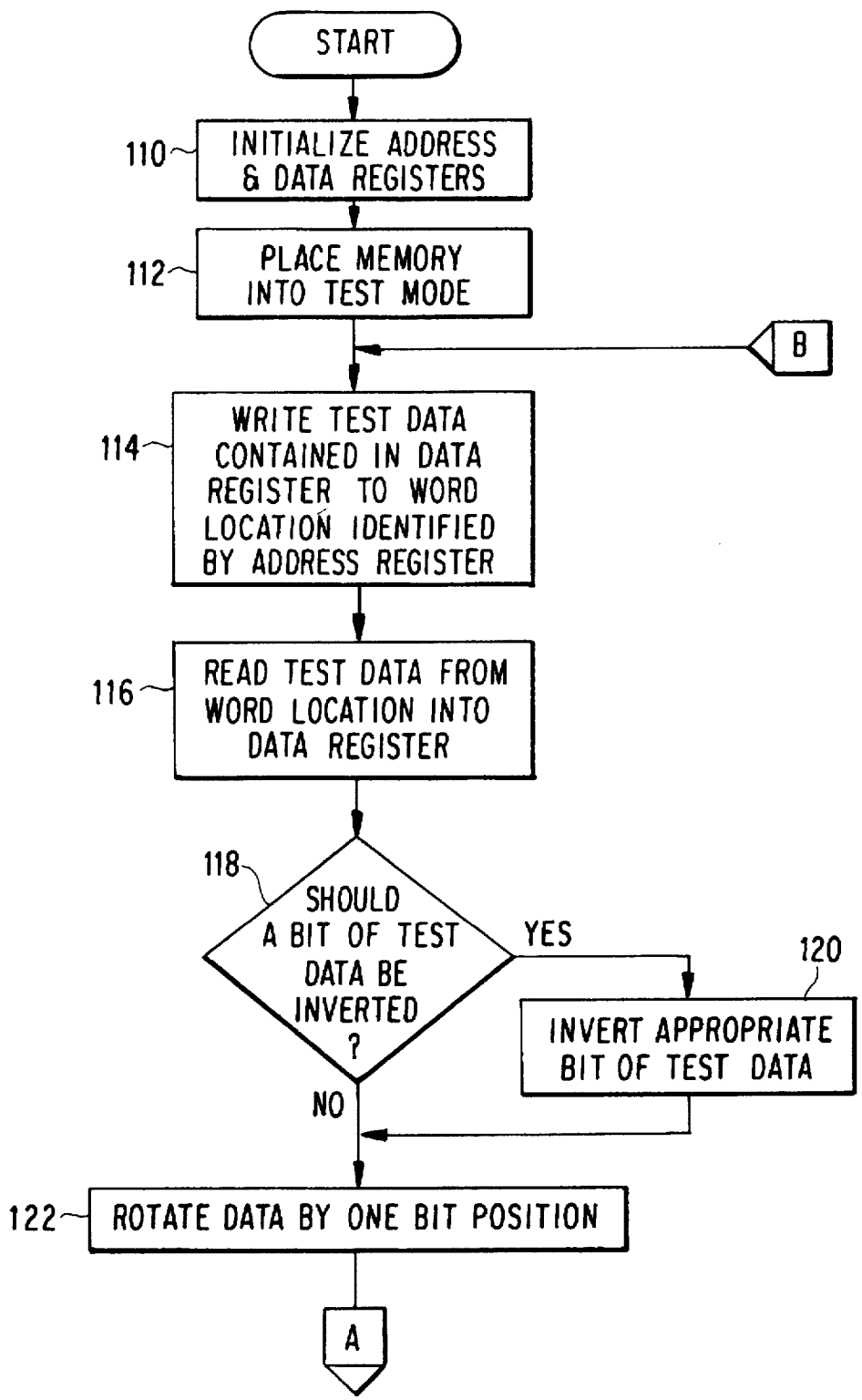
FIGS. 3(a) and 3(b) are flow charts illustrating a second embodiment of the present invention.
Figure 3B:
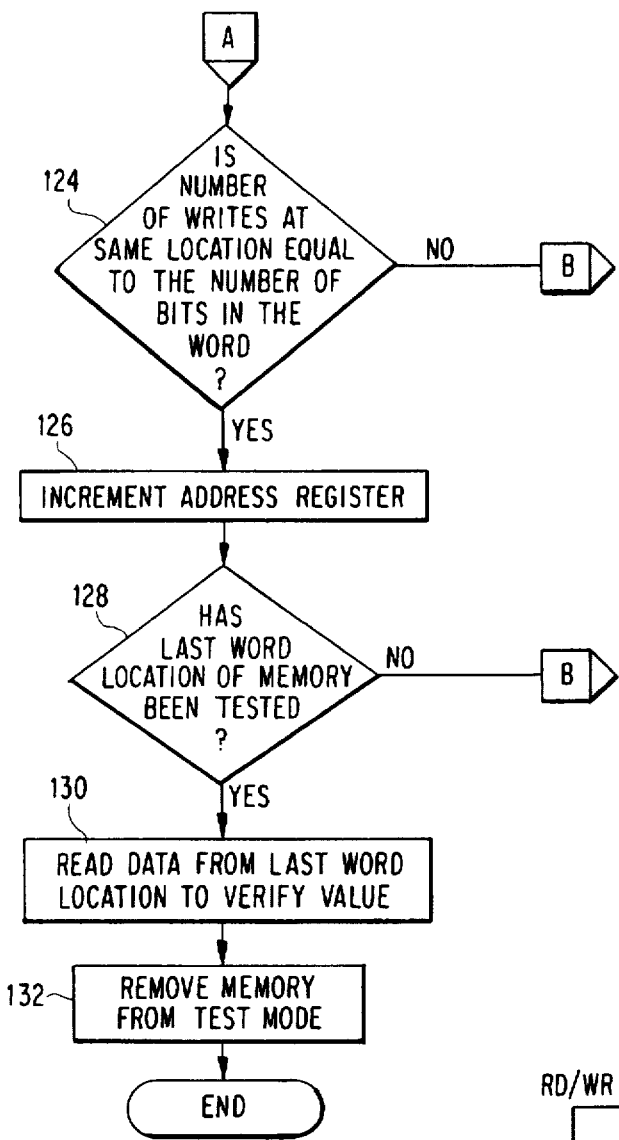

FIGS. 3(a) and 3(b) are flow charts illustrating a second embodiment of the fault coverage testing method. The second embodiment of the present invention is much like the first embodiment. The differences in flow of the respective methods, as seen by comparing FIGS. 2(a) and 2(b) with FIGS. 3(a) and 3(b), show the flexibility of the method. Since the method flow is flexible, it is likely that the structure of the integrated circuit will be considered when determining how the flow can be most efficiently performed.

A detailed description of the operation of the second embodiment follows.

First, an address register and a data register on the chip are initialized (step 110). For example, the address register can be initialized to a beginning word location of the memory such as "0" and data register can be initialized to contain initial test data such as $01_{HEX}$. Next, the memory is placed into a test mode (step 112). This is achieved by an input signal to the chip.

Next, the test data held in the data register is written to the word location identified by the address register (step 114). After the test data has been written to the word location, the test data is then read from the same word location and placed into the data register again (step 116).

Next, the method determines whether or not its time to invert a bit of the test data contained within the data register (step 118). The basic principal is that a single bit of each of the word locations in the memory is to be inverted one time during the testing of each of the word locations in the memory. Steps 118 and 120 correspond to steps 14 and 16 in FIG. 2(a).

Preferably, the present invention makes the determination of which bit to invert using a predetermined scheme which takes the four principals discussed above into account. The predetermined scheme makes the determination of which bit of the test data to invert based on the word location. Each of the word locations in the memory receives test data which is unique to the test data received by all other word locations. Table 2 provides an example of one such predetermined scheme. Namely, Table 2 indicates the bits of the test data to be inverted for a memory having thirty-two word locations.

TABLE 2

| Word Location | Bit Inverted |
|---|---|
| 0 | 7 |
| 1 | 6 |
| 2 | 7 |
| 3 | 5 |
| 4 | 4 |
| 5 | 5 |
| 6 | 3 |
| 7 | 2 |
| 8 | 3 |
| 9 | 1 |
| 10 | 0 |
| 11 | 1 |
| 12 | 7 |
| 13 | 6 |
| 14 | 7 |
| 15 | 5 |

TABLE 2-continued

| Word Location | Bit Inverted |
|---|---|
| 16 | 4 |
| 17 | 5 |
| 18 | 0 |
| 19 | 1 |
| 20 | 0 |
| 21 | 2 |
| 22 | 3 |
| 23 | 2 |
| 24 | 4 |
| 25 | 5 |
| 26 | 4 |
| 27 | 6 |
| 28 | 7 |
| 29 | 6 |
| 30 | 4 |
| 31 | 6 |

The test data in the data register is rotated by one bit position (step 122) before being written to the word location again. Note that in practice, steps 116, 120, and 122 may be combined into a single operation.

Table 3 provides an example of the test data stored and the rotations and inversions performed for several of the word locations. Note, Table 3 assumes that the data register is initialized to the value $01_{HEX}$ as shown in row a. Hence, as shown in Table 2, the seventh bit of the test data is inverted prior to being written to word location "0". This is illustrated in Table 3 by row b which shows the test data after the seventh bit is inverted (step 120) and then rotated (step 122). Assuming that the memory under test does not contain a fault, when the test data is almost immediately thereafter read from the word location "0", the value $CO_{HEX}$ is obtained (step 122), which is the same value that was written in step 114.

TABLE 3

TEST DATA (READ/WRITE)

| | 7 | 6 | 5 | 4 | 3 | 2 | 1 | 0 | Bit Position |
|---|---|---|---|---|---|---|---|---|---|
| a | 0 | 0 | 0 | 0 | 0 | 0 | 0 | 1 | Word location 0 (int.) |
| b | 1 | 1 | 0 | 0 | 0 | 0 | 0 | 0 | - invert & 1st rotation |
| c | 0 | 1 | 1 | 0 | 0 | 0 | 0 | 0 | - 2nd rotation |
| d | 0 | 0 | 1 | 1 | 0 | 0 | 0 | 0 | - 3rd rotation |
| e | 0 | 0 | 0 | 1 | 1 | 0 | 0 | 0 | - 4th rotation |
| f | 0 | 0 | 0 | 0 | 1 | 1 | 0 | 0 | - 5th rotation |
| g | 0 | 0 | 0 | 0 | 0 | 1 | 1 | 0 | - 6th rotation |
| h | 0 | 0 | 0 | 0 | 0 | 0 | 1 | 1 | - 7th rotation (final) |
| i | 1 | 1 | 0 | 0 | 0 | 0 | 0 | 1 | Word location 1 (int.) |
| j | 1 | 1 | 1 | 0 | 0 | 0 | 0 | 0 | - invert & 1st rotation |
| ⋮ | | | | | | | | | ⋮ |
| k | 1 | 1 | 1 | 1 | 1 | 1 | 0 | 1 | Word Loc. 31 (final) |

Next, it is determined whether the number of writes to the same word location is equal to the number of bits in the test data (step 124). For example, if the data register holds an eight bit word, then eight writes will be performed. The example illustrated in Tables 2 and 3 assumes that the test data consists of an eight bit word. Therefore, according to step 124 eight writes will be performed. If the number of writes is equal to the number of bits in the test data, then the processing returns to step 114. Hence, step 124 insures that the test data will be completely rotated through each of the word locations. The writes and rotations for word location "0" are illustrated in rows b–h. As previously discussed, following each rotation corresponding to rows b–h, the writing and reading of the test data to/from the same word location are repeated without any inverting of bits. This follows from step 118 which causes step 120 to invert a bit of the test data only during the second write operation to a particular word location in the memory.

After the test data corresponding to the seventh rotation has been written and read, step 124 determines that the number of writes equals the number of bits in the test data and, therefore, increments the address register to correspond to the next word location (step 126). Then, it is determined whether the last word location of the memory has been tested (step 128). If not, the processing returns to step 114 to repeat the writing, reading and rotating operations for the next word location.

In Table 3 row i illustrates the test data after performing step 128, which is the initial value written to word location "1", and row j illustrates the test data which is first stored in word location "1" after bit 6 has been inverted (step 120), the first rotation has been performed (step 122), and the second write has occurred (step 114).

Thereafter, the write, read and rotate operations for the word location "1" will continue until eight writes have occurred at that word location. Then, the address register will be again incremented (step 126), and a determination again made in step 128.

When the last word location of the memory has been tested, then the test data read from the last word location will be read to verify its value (step 130). That is, the test data read from the last word location will contain a predetermined value, provided no faults exist. If the test data read from the last word location does not coincide with the predetermined value, then the integrated circuit under test is defective. Table 4 illustrates final register values for the example which tests a memory having thirty-two memory elements or cells and uses the bit inversion sequence of Table 2. Note, Table 4 assumes the register is initialized to $01_{HEX}$.

TABLE 4

| ADDR. | FINAL REGISTER VALUE |
|---|---|
| 0 | 03 = 00000011 |
| 1 | 83 = 10000011 |
| 2 | 82 = 10000010 |
| 3 | C2 = 11000010 |
| 4 | E2 = 11100010 |
| 5 | A2 = 10100010 |
| 6 | B2 = 10110010 |
| 7 | BA = 10111010 |
| 8 | AA = 10101010 |
| 9 | AE = 10101110 |
| 10 | AC = 10101100 |
| 11 | A8 = 10101000 |
| 12 | A9 = 10101001 |
| 13 | 29 = 00101001 |
| 14 | 28 = 00101000 |
| 15 | 68 = 01101000 |
| 16 | 48 = 01001000 |

TABLE 4-continued

| ADDR. | FINAL REGISTER VALUE |
|---|---|
| 17 | 08 = 00001000 |
| 18 | 0A = 00001010 |
| 19 | 0E = 00001110 |
| 20 | 0C = 00001100 |
| 21 | 04 = 00000100 |
| 22 | 14 = 00010100 |
| 23 | 1C = 00011100 |
| 24 | 3C = 00111100 |
| 25 | 7C = 01111100 |
| 26 | 5C = 01011100 |
| 27 | DC = 11011100 |
| 28 | DD = 11011101 |
| 29 | 5D = 01011101 |
| 30 | 7D = 01111101 |
| 31 | FD = 11111101 |

For example, if the bit inversion scheme illustrated in Table 2 is used, the last word location "31" (assumed to be the last word location) would yield $FD_{HEX}$ if no faults exist. Thus, if the value in word location "31" is a value other than $FD_{HEX}$, the memory is defective. Once the verification has been performed, the memory is removed from the test mode (step 134), thus completing the testing of the memory.

As illustrated in Table 4, each of the word locations ends up with a unique final value. Note that each word can only have a unique value if the number of word location is less than $2^{(number\ of\ bits\ in\ a\ word)}-2$. Hence, the present invention will test all the bits of each word location for faults. At the same time, due to the inversion scheme, the addressing of the memory is verified because each word location can be processed only once else the value stored therein is corrupted. If any of the final values of the word locations are corrupted, that is, do not have its unique value, then the final value of the last memory location will also be corrupted. This allows the testing in step 130 of only the last word location. If the value in the last word location is not the predetermined unique value it should be, the integrated circuit is either discarded or further analysis is performed to locate the faults.

Figure 4:
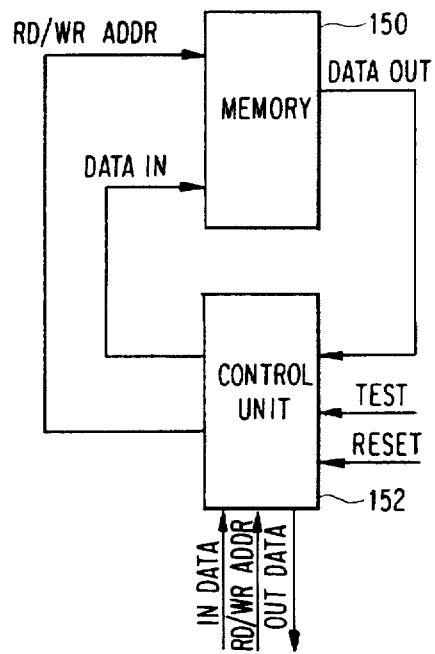
FIG. 4 is a basic block diagram illustrating a system according to the present invention.

FIG. 4 is a basic block diagram illustrating a system which performs the method described above. A memory 150 is tested by a control unit 152 which performs the writing, reading and rotating operations discussed above. The control unit receives a read/write address (RD/WR ADDR) signal and input data (INDATA) as inputs, and supplies output data (OUTDATA) as an output. The control unit 152 is initialized by a reset signal (RESET), and placed in a test mode by a test signal (TEST). The control unit 152 provides the read/write address (RD/WR ADDR) signal to the memory 150. The test data output from the control unit 152 (DATAIN) is input to the memory 150 at the word location designated by the write address. The test data output from the memory 150 (DATAOUT) corresponds to the read address provided by the control unit 152. The test data output from the memory 150 (DATAOUT) is then fed back to the control unit 152 where the rotation and inversion operations of the method described above are performed.

The chip, i.e., integrated circuit, being tested contains at least the memory 150 and may include all or part of the control unit 152. Normally, to facilitate on-chip testing, all of the control unit 152 will reside on the chip because it requires only a minimal number of gates and test vectors. The only test vectors which are required are one test vector per bit of each memory element and test vectors for reading the last memory element.

FIGS. 5(a)–5(g) are block diagrams illustrating a detailed example of a system according to the present invention. The system includes an address buffer 200 which latches an address from an input data bus in accordance with an address latch enable signal (ALE) when a chip select signal (CS) is high. The address held in the address buffer 200 is output to an address decoder 202 which decodes the address and outputs a read select signal (RDSEL) or a write select signal (WRSEL) to a memory core 204. The read select signal (RDSEL) or the write select signal (WRSEL) from the address decoder 202 selects one of the word locations within the memory core 204 for a read or write operation, respectively. During a read operation the data (DATAIN) to be input to the memory core 204 is held and output by the data buffer 206. The data buffer 206 receives input data (INDATA) from the input data bus and receives test data (TDATA) from a test unit 208 during a test mode. The data buffer 206 outputs either the test data (TDATA) rotated by one bit position or the input data (INDATA) as the data (DATAIN) to be input to the memory core 204.

The test mode is enabled by a mode selection signal (RAMTEST) received by the address buffer 200, the data buffer 206 and the test unit 208. The mode selection signal (RAMTEST) selects one of a test mode and a normal mode as the operational mode of the chip. In the normal mode, the chip functions normally without hinderance from the testing circuitry. Namely, the data buffer 206 outputs the input data (INDATA) to the memory core 204 location selected by the write select signal (WRSEL). On the other hand, in the test mode, the data buffer 206 outputs the test data (TDATA) to the address of the memory core 204 selected by the write select signal (WRSEL). Further, the test unit 208 is operational in the test mode to read the output data (DATAOUT) from the memory core 204 at the address selected by the read selection signal (RDSEL). The test unit 208 also receives bit information signals (BIT) from the address buffer 200 and the read selection signal (RDSEL) from the address decoder 202, which are used to determine whether an inversion operation should be performed on one of the bits of the output data (DATAOUT) from the memory core 204 as the output data (DATAOUT) is being transformed into test data (TDATA). The inversion operation occurs only once during the rotation process for a given word location. In the case where the inversion operation is not performed, the output data (DATAOUT) from the memory core 204 is received by the test unit 208, and then output as test data (TDATA) to the data buffer 206. Thereafter, the data buffer 206 receives the test data (TDATA) and then outputs the test data (TDATA) which has been rotated by one bit position as the data (DATAIN) to be input to the memory core 204 in accordance with a write enable signal (WRITE) output by the test unit 208.

Figure 5A:
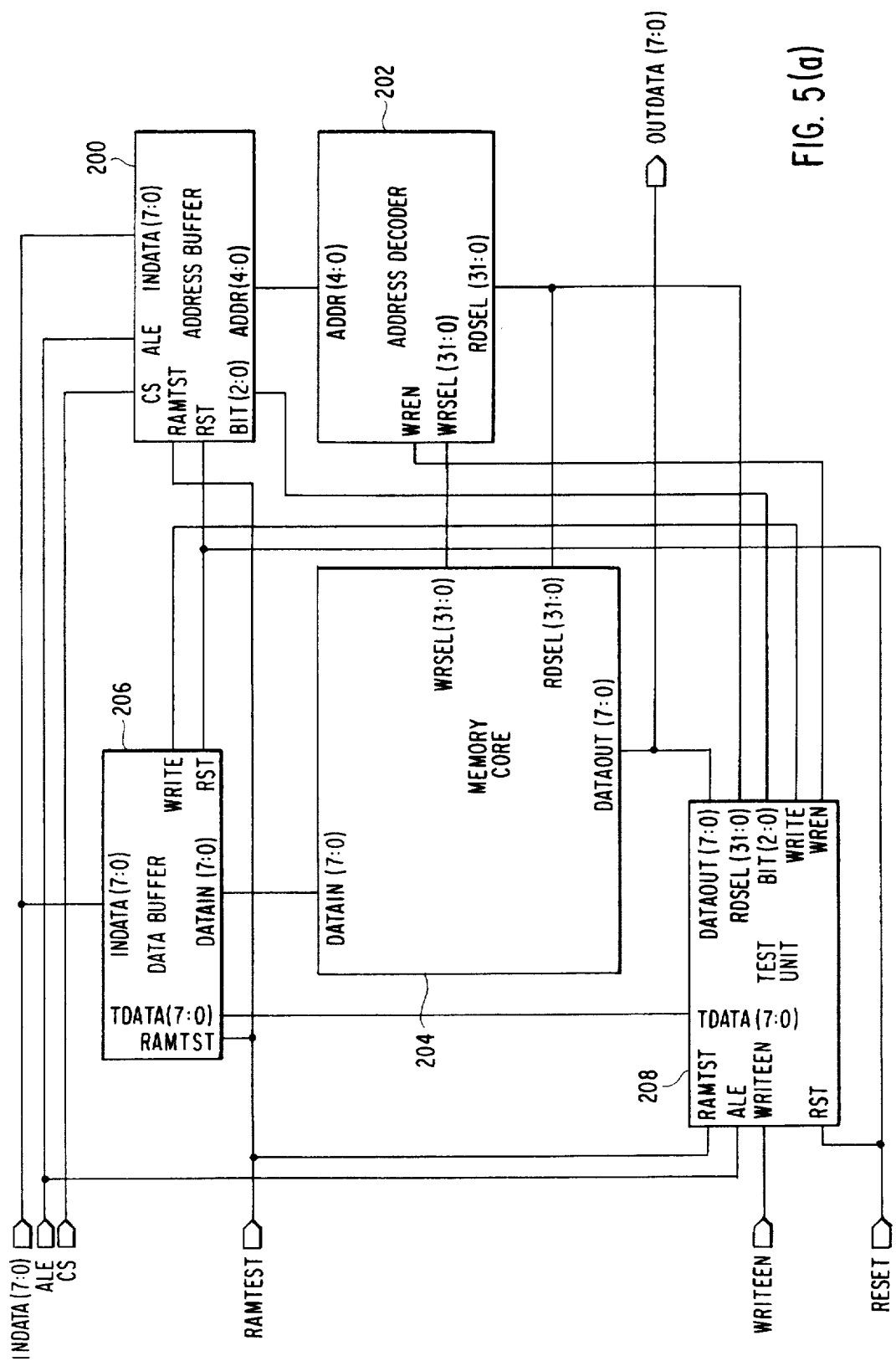
Figure 5B:
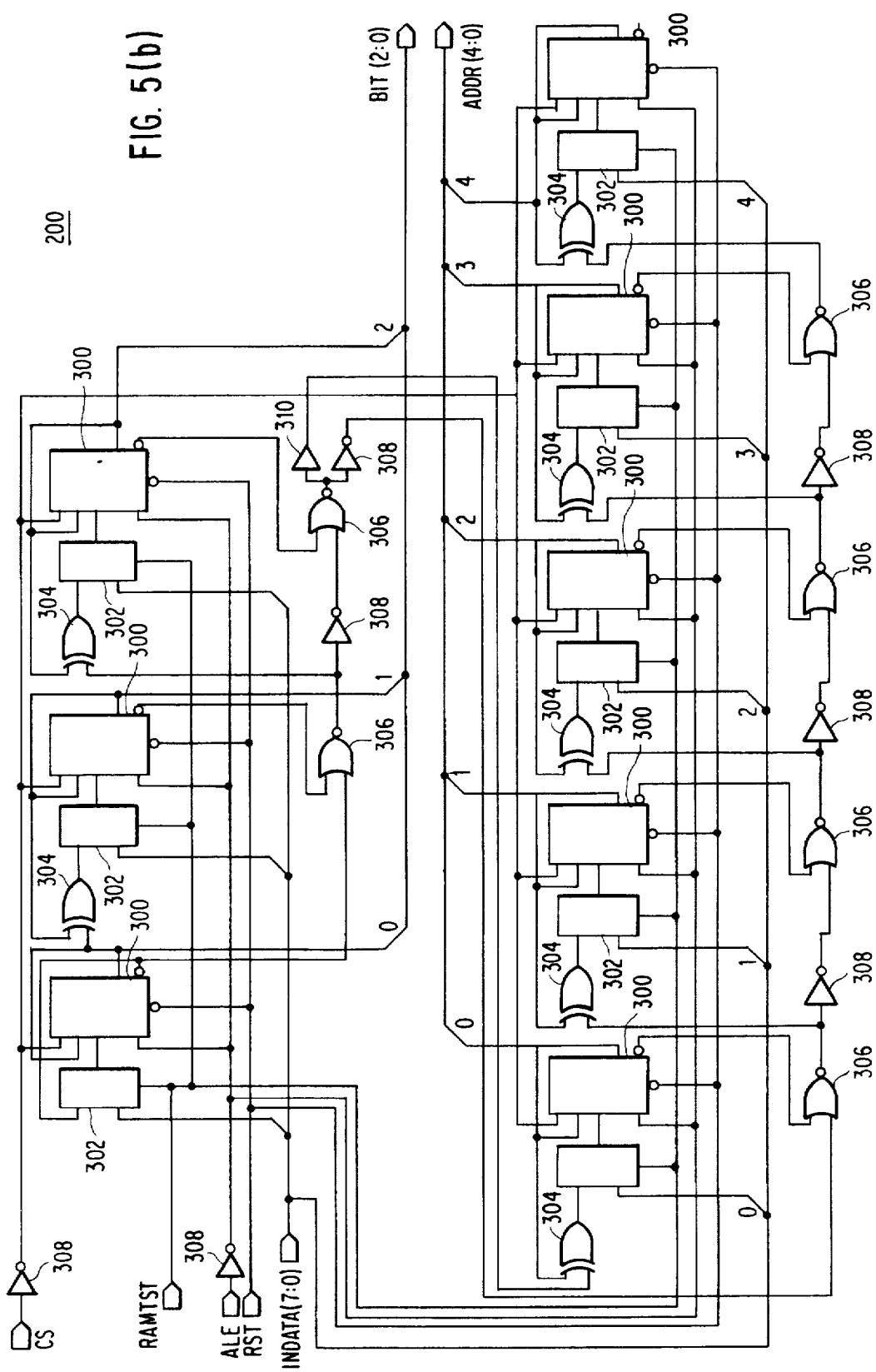

FIG. 5(b) illustrates the address buffer 200 in further detail. The address buffer 200 is an eight bit latch which comprises flip-flops 300 having 2-to-1 multiplexers 302 feeding the data input terminal of the flip-flops 300. During the normal mode, the address latch enable signal (ALE) latches the address (INDATA) into the flip-flops 300 when the chip select signal (CS) is high. Hence, in the normal mode, the address (ADDR) output from the address buffer 200 is a five bit address corresponding to the five least significant bits of the latch. During the test mode, the additional gates contained in the address buffer 200, namely exclusive-ORs 304, NORs 306, inverters 308 and driver 310, transform the latch into an 8-bit binary counter. The three most significant bits of the latch form bit information signals (BIT). In the test mode, the three most significant bits of the latch become the three least significant bits of the counter, and the five least significant bits of the latch become the five most significant bits of the counter. Hence, during the test mode, the bit information signals (BIT), that is, the three least significant bits of the counter, count the bit position in a word, while the five most significant bits of the counter sequentially address each of the word locations of the memory core 204.

Figure 5C:
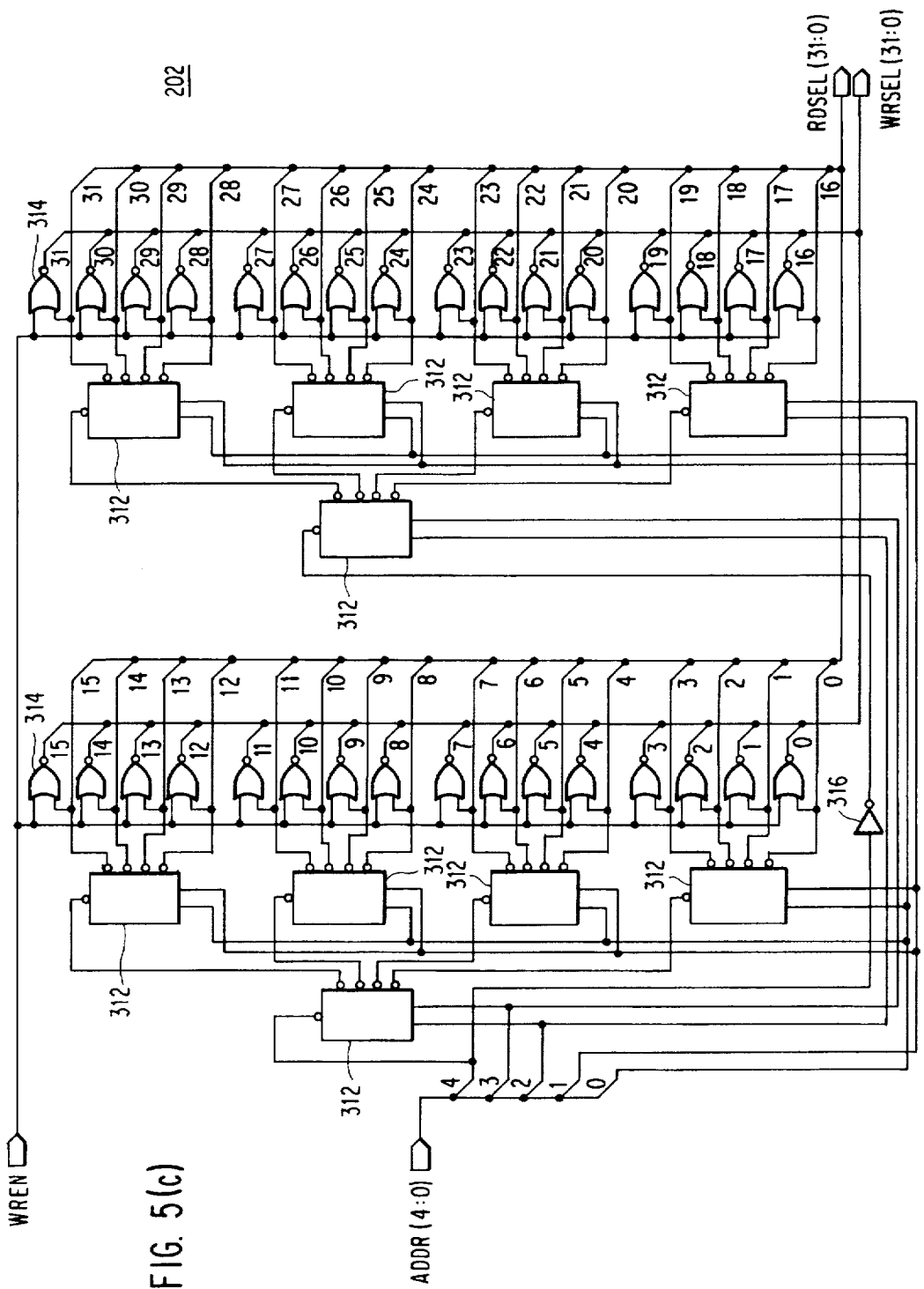

FIG. 5(c) illustrates the address decoder 202 in further detail. The address decoder includes 2-to-4 demultiplexers (decoders) 312, NORs 314 and an inverter 316. The address decoder 202 decodes the five bits of the address (ADDR) received from the address buffer 200 into the read selection signals (RDSEL) and the write selection signals (WRSEL). The write selection signals (WRSEL) are gated with a master write enable signal (WREN) to prevent writing from occurring while the address is being changed.

FIG. 5(d) illustrates the data buffer 206 in further detail. The data buffer 206 is an eight bit latch including eight flip-flops 318, two groups of eight 2-to-1 multiplexers 220 and an inverter 322. The first group of multiplexers 320 selects the input to the flip-flops 318 as being either the input data (INDATA) during the normal mode or the test data (TDATA) during the test mode. The first group of multiplexers 320 are arranged to cause the test data (TDATA) received from the test unit 208 to be rotated one bit position to the right. Thus, in this embodiment of the system according to the present invention, the data buffer 206 is performing the rotation. This is a gate efficient method of performing the rotation process. The second group of multiplexers 320 selects either the input data (INDATA) directly or the data held in the flip-flops 318 as the data (DATAIN) output from the data buffer 206, which is input to the memory core 204.

Figure 5E:
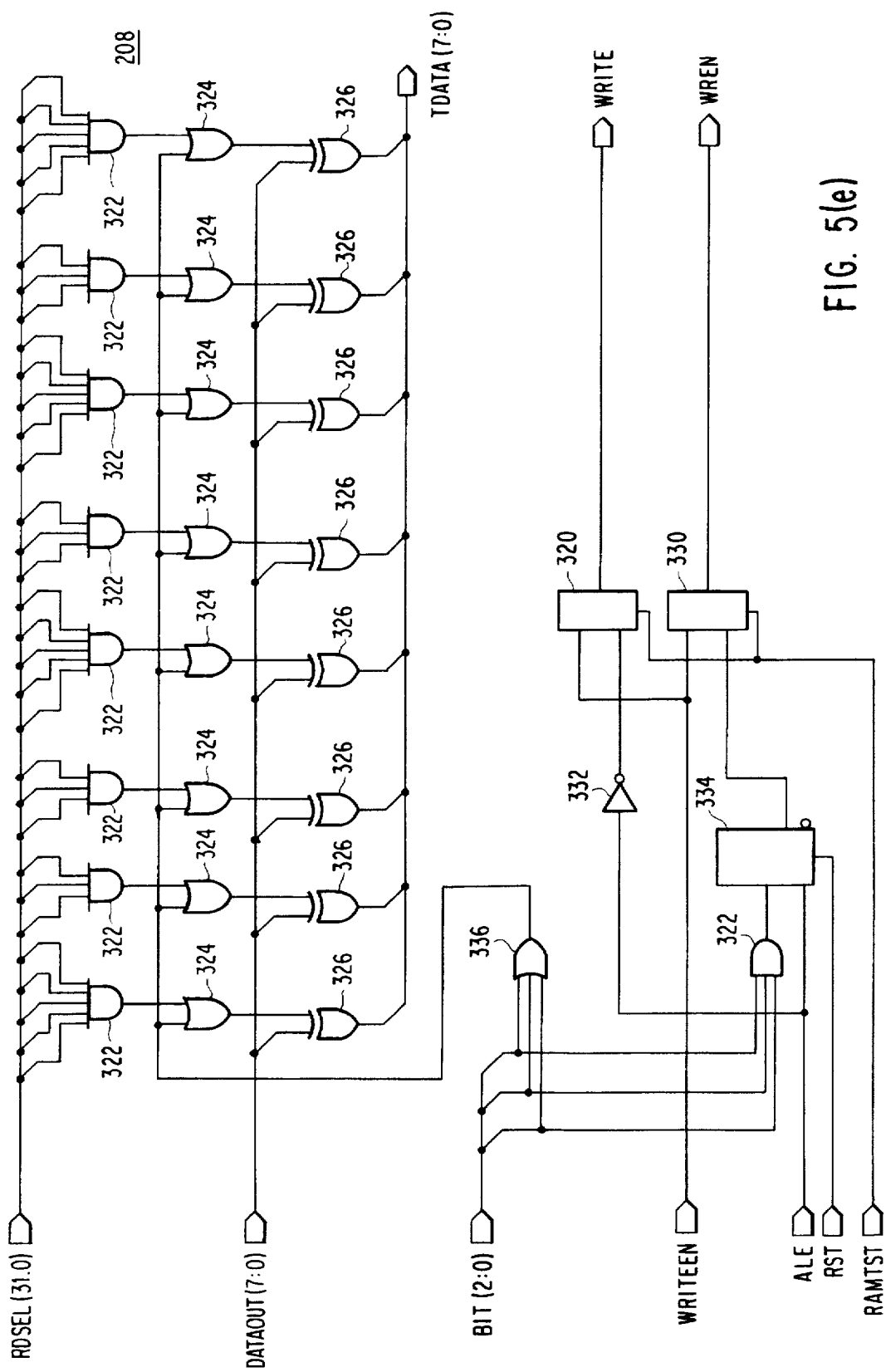

FIG. 5(e) illustrates the test unit 208 in further detail. The test unit 208 provides additional circuitry needed for the testing of the memory core 204 during the test mode. The test unit 208 includes AND gates 322, NOR gates 324, exclusive-OR gates 326, selectors 328 and 330, an inverter 332, a flip-flop 334, and an OR gate 336. The output data (DATAOUT) from the memory core 204 is received and supplied to one terminal of each of the exclusive-OR gates 326. The other terminal of the exclusive-OR gates 326 receives the outputs of the NOR gates 324 which are produced as follows. One terminal of the NOR gates 324 receives select signals output by the AND gates 322. The other terminal of the NOR gate 324 receives a time-to-invert signal (TINV). The time-to-invert signal (TINV) is produced by the bit information signals (BIT) from the address buffer 200 and the OR gate 336. The time-to-invert signal (TINV) causes the inversion of one of the bits of the output data (DATAOUT) to occur only once for each word location. That is, the time-to-invert signal (TINV) is used so that the inversion of a bit of the output data (DATAOUT) is allowed only during a one bit period of the rotation process for a given word location. The example illustrated in FIG. 5(e) inverts a bit of the output data (DATAOUT) after the initial write to the word location. The AND gates 322 each receive an odd number of the read select signals.

In addition to the output of the test data (TDATA), the test unit 208 also outputs the write clock signal (WRITE) and the master write enable signal (WREN). The master write enable signal (WREN) is produced by selector 330, flip-flop 334 and AND gate 322 together with the bit information signals (BIT), the address latch enable signal (ALE), the mode selection signal (RAMTEST) and a normal write enable signal (WRITEEN). In the test mode, the master write enable signal (WREN) enables the writing to the memory core 204 at all times except when the address in the address buffer 200 is being changed. The write clock signal (WRITE) is produced by selector 328 and the inverter 332 of the test unit 208 together with the mode selection signal, the address latch enable signal (ALE) and the normal write enable signal (WRITEEN). The write clock signal (WRITE) provides the continuous clock pulses of latch enable signal (ALE) in the test mode so that test data (TDATA) can be almost immediately latched in the data buffer 206, written to the memory core 204, and then read out from the memory core 204. In normal operation, both the write clock signal (WRITE) and the master write enable signal (WREN) are equal to the normal write enable signal (WRITEEN).

The selection of the read select signals (RDSEL) (supplied to the AND gates 322) for each of the bits of the output data (DATAOUT) from the memory core 204 are chosen such that each of the bits of the output data (DATAOUT) will be inverted by an odd number of the read select signals (RDSEL). Also, in this embodiment, each bit of the address (ADDR) will affect at least one bit of the output data (DATAOUT) an odd number of times in both its high and low states. In addition, the selection of the read select signals (RDSEL) is such that the same data bit will not be inverted in two consecutive word locations. Further, the selection is made such that a unique value is left in each of the word locations at the end of the test. Thus, this embodiment achieves the four principals of the inversion scheme discussed above. As a result, virtually all faults in the memory and the associated circuitry, together with their connecting lines, can be detected.

Figure 5F:
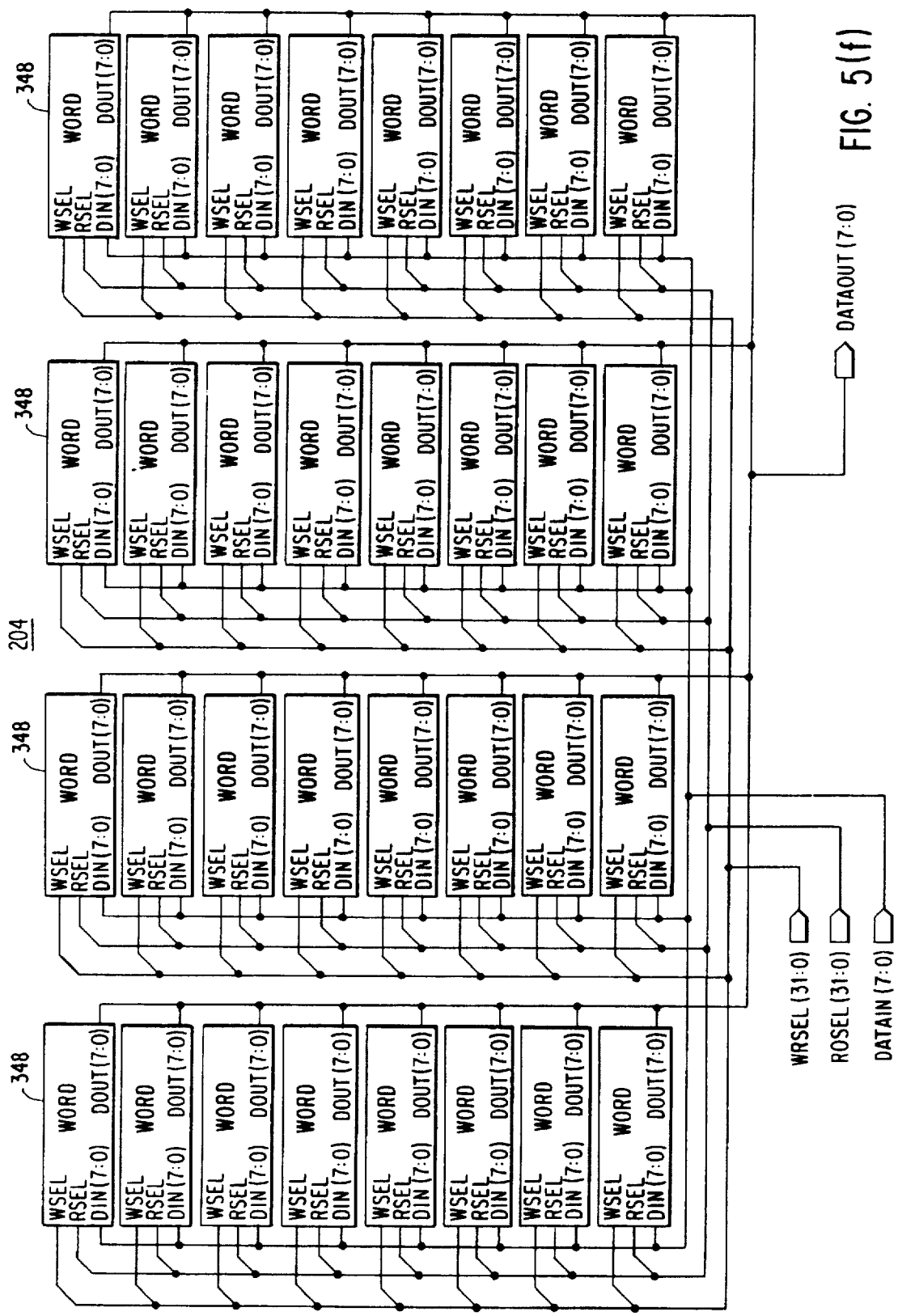
Figure 5G:
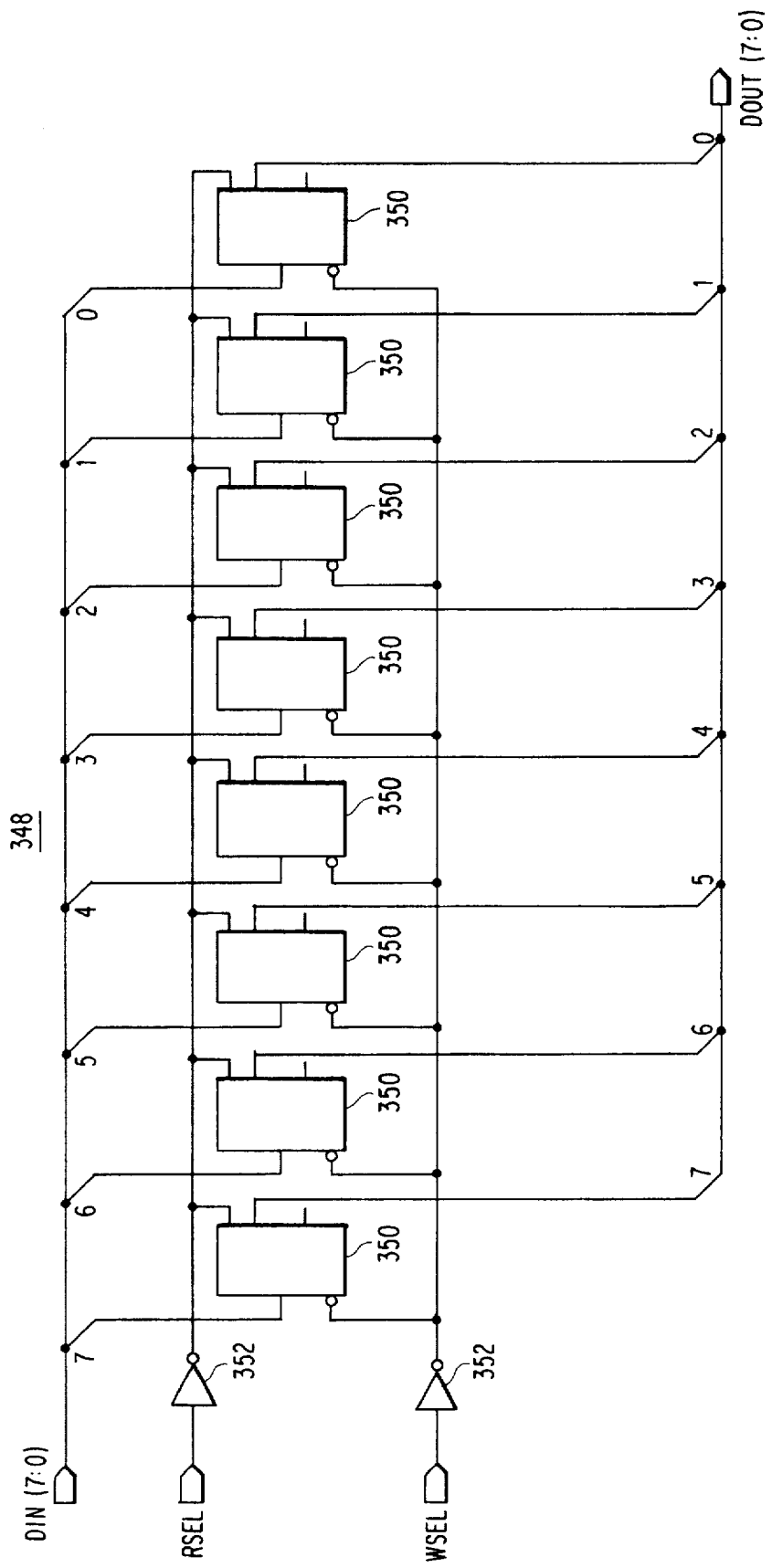

In the example illustrated in FIGS. 5(a)-(g) the memory core 204 includes thirty-two word locations which are to be tested. FIG. 5(f) illustrates the memory core 204 in further detail. The memory core 204 includes thirty-two word registers 348 each storing a word of data. FIG. 5(g) illustrates one of the word registers 348 in further detail. The word register 348 includes eight transparent latches 350 having tri-state outputs and two inverters 352. Each of the transparent latches 350 correspond to a static RAM cell.

Although FIGS. 5(a)-(g) illustrate a detailed example of a fault coverage testing system for a memory core 204 consisting of thirty-two eight bit words, the present invention is expandable to provide fault coverage testing of a memory of any size and word length.

In the case where the word length of the memory is less than the word length of the test data, the present invention can test the memory by combining locations of the memory by modifying the address selection circuitry. For example, two four bit locations can be combined for testing when the word length of the test data is eight bits. Also, a six bit location can borrow two bits from another location to form eight bits.

Further, the memory under test can be any integrated circuit with memory, for example, a memory chip, an ASIC or a VLSI design. The memory only need be readable and writable, for example, static RAM, D-flip flop registers, dynamic RAM or erasable-programmable-read-only-memory (EPROM).

Many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, accordingly all suitable modifications and equivalents may be resorted to as falling within the true spirit and scope of the invention.

What is claimed is:

1. A method for fault testing an integrated circuit having a memory with a plurality of word locations, each location having a predetermined number of bits, said method comprising the steps of:

(a) setting test data to an initial value;

(b) testing the plurality of word locations using said test data by:

(c) writing the test data to a first word location in order to test one or more bits of said first word location;

(d) reading the test data from said first word location, uniquely modifying the test data by rotating said test data by at least one bit position, and writing said modified test data back to said first word location to further test said one or more bits of said first word location;

(e) repeating step (d) until each of the predetermined number of bits of said first word location has been tested;

(f) obtaining the test data from said first word location and uniquely modifying the test data in order to test a subsequent word location and each bit therein, said test data being uniquely modified by rotating said test data by at least one bit position and by inverting at least one bit of said test data; and (g) repeating the above steps in order to automatically, dependently test each bit of each of the word locations for a fault using uniquely modified test data, wherein each word location is tested with test data that is unique compared to the test data used to test each of the other word locations of the memory.

2. A method as recited in claim 1, wherein each of the word locations after being tested contains a final word value, and wherein step (g) comprises the step of determining if the memory is faulty based on the final word value of a last word location in the memory.

3. A method as recited in claim 2, wherein the final word value of the last word location equals the logical inverse of the initial value.

4. A method as recited in claim 2, wherein the final word value of the last word location equals the logical inverse of the initial value rotated by a fixed amount.

5. A method as recited in claim 2, further comprising the step of processing the final word value of the last word location in the memory to locate a faulty word location.

6. A method as recited in claim 1, wherein each of the word locations after being tested contain a final word value, and wherein step (g) comprises the step of determining the word locations or associated circuits which are faulty based on the final word value for each of the word locations.

7. A method for testing a memory device in a test mode using an address register and a data register, said method comprising the steps of:

(a) initializing the address register and the data register;

(b) inverting a bit of data in the data register prior to testing each of the word locations of the memory;

(c) transferring the data in the data register to a word location of the memory device identified by the address register to test one or more bits of the word location;

(d) transferring, immediately following said transferring in step (c), the data output from the word location of the memory device identified by the address register into the data register;

(e) rotating the data transferred in step (d) by at least one bit position prior to testing the remaining bits of the word location;

(f) repeating steps (c)–(e) a predetermined number of times in order to test each bit of the word location;

(g) incrementing the word location in the address register;

(h) obtaining the test data from the word location, and repeating steps (b)–(g) in order to test each of the remaining word locations; and (i) testing the memory device based on the data output from one or more of the word locations, wherein each word location is tested with test data that is unique compared to the test data used to test each of the other word locations of the memory.

8. A method as recited in claim 7, wherein the predetermined number of times corresponds to the number of bit positions of the data.

9. A method as recited in claim 7, wherein step (b) comprises the steps of:

(b1) determining the bit of the data to be inverted based on the word location; and (b2) inverting the bit of the data determined in step (b1).

10. A method as recited in claim 7, wherein step (i) comprises the steps of comparing the data output from a last word location of the word locations of the memory device with a predetermined value; and processing the data output from the last word location so as to locate a faulty word location.

11. An integrated circuit having a self-test mode, comprising:

a memory having a plurality of word locations, each location being individually addressable;

addressing means coupled to said memory for addressing individual word locations of said memory;

data holding means coupled to said memory for holding data to said memory;

inversion means, coupled to said memory and said data holding means, for inverting at least one bit of test data prior to testing each of the word locations to produce unique test data for the word locations;

rotation means, coupled to said memory, said data holding means, and said inversion means, for rotating the test data by at least one bit position prior to testing each bit of each of the word locations; and control means, coupled to said addressing means, data holding means, inversion means, and rotation means, for controlling sequential testing of each of the word locations in said memory, wherein each word location is tested with test data that is unique compared to the test data used to test each of the other word locations of the memory.

12. An integrated circuit as recited in claim 11, wherein said rotation means and said data holding means are formed together in a data buffer.

13. An integrated circuit as recited in claim 11, wherein said control means further controls testing said addressing means and said data holding means while testing said memory.

14. An integrated circuit as recited in claim 13, wherein said inversion means primarily tests said addressing means and said rotation means primarily tests said data holding means and said memory.

15. An integrated circuit as recited in claim 14, wherein each of the word locations has a final value when testing is completed, and wherein said integrated circuit further comprises fault locating means for locating one or more faults.

16. A system, comprising:

a memory including one or more word locations each capable of storing data; and control means coupled to said memory for testing said one or more word locations of said memory, said control means comprising:

means for transferring test data to a word location of said memory, means, coupled to an output of the memory, for receiving the test data back from the word location of said memory, means, coupled to said receiving means, for rotating the test data by one bit position prior to testing each bit of each word location, and means, coupled to said receiving means, for inverting at least one bit of said test data prior to testing each word location of said memory, wherein said control means is operative to control said transferring, receiving, rotating, and inverting means so as to perform the transferring, receiving, rotating, and inverting of the test data a predetermined number of times in order to test each bit of each word location in said memory, such that each word location is tested with test data that is unique compared to the test data used to test each of the other word locations of the memory.

17. A system as recited in claim 16, wherein said receiving means received the test data immediately after transferring the test data.

18. A system as recited in claim 16, wherein word locations are combined when the word length of the test data exceeds the word length of the word locations, and wherein the predetermined number of times corresponds to the word length of the test data.

19. A system as recited in claim 16, wherein said control means comprises:

bit inversion means for identifying the bit of the test data to be inverted in accordance with a predetermined scheme and for inverting the bit of the test data identified; and rotation means for rotating the test data received by one bit position.

20. A system as recited in claim 16, wherein said control means tests said memory means by comparing the test data received from a last word location of the word locations with a predetermined value.

21. A system for testing a memory device, comprising:

a memory having a plurality of word locations, each location being operative to store data;

data buffer means, coupled to an input of said memory, for holding the data;

address buffer means coupled to said memory for holding an address associated with the data and for addressing one of said plurality of word locations;

address decoder means, coupled to said address buffer means and said memory, for decoding the address and outputting a write select signal to said memory;

test mode selection means for selecting a test mode of operation; and test control means, coupled to said memory, data buffer means, and address buffer means, for controlling the testing of said memory during the test mode, said test control means comprising means for inverting a bit of input test data prior to testing each word location of said memory; means, coupled to said inverting means and an input of said data buffer means, for transferring the input test data to said memory through said data buffer means; and means, coupled to an output of said memory, for transferring output test data output from said memory into said data buffer means; wherein, said data buffer means comprises means for rotating the output test data by at least one bit position prior to testing each bit of each word location of said memory; and wherein said test control means is operative to control said inverting, transferring and rotating a predetermined number of times in order to test each of said plurality of word locations with unique test data such that each word location is tested with test data that is unique compared to the test data used to test each of the other word locations of the memory; and said test control means further comprising means for testing said memory based on the output test data of one or more word locations.

22. A system as recited in claim 21, wherein said test control means transfers the output test data immediately after writing the input test data.

23. A system as recited in claim 21, wherein the rotating by said test control means of the output test data produces adjusted output test data, and the repeating by said test control means uses the adjusted output test data as the input test data to said memory means.

24. A system as recited in claim 23,
wherein said test control means comprises means for comparing the adjusted output test data for a last word location of the word locations with a predetermined value and means for locating a faulty word location.

25. A system as recited in claim 21,
wherein said means for inverting the bit of test data is sequenced to create a unique test data pattern for each of the word locations based on the address of the word location currently under test.

26. A system as recited in claim 25,
wherein each of the word locations has a final value when testing is completed, and
wherein said system further comprises fault locating means for locating one or more faults in at least one of said memory, said data buffer means, said address buffer means and said address decoder means.

27. An integrated circuit having a self-test mode, said integrated circuit comprising:
a memory having a plurality of word locations, each location being operative to store data;
data buffer means for receiving and holding input data;
address buffer means coupled to said memory for receiving and holding an address associated with the data;
address decoder means, coupled to said address buffer means and said memory, for decoding the address and producing a write select signal to said memory; and
test control means, coupled to said memory, data buffer means, and address buffer means, for controlling testing of said memory during the self-test mode, said test control means comprising means for inverting a bit of input test data prior to testing each word location of said memory; means, coupled to an input of said data buffer means, for transferring the input test data to said memory through said data buffer means; means, coupled to an output of said memory, for receiving output test data from said memory; means, coupled to said receiving means, for rotating the output test data by at least one bit position prior to testing each bit of each word location of said memory; and wherein said test control means is operative to control said transferring, receiving, rotating, and inverting a predetermined number of times in order to test each of said plurality of word locations with unique test data such that each word location is tested with test data that is unique compared to the test data used to test each of the other word locations of the memory; and said test control means further comprising means for testing said memory based on the output test data.

28. An integrated circuit as recited in claim 27,
wherein, upon being placed into the self-test mode, said test control means automatically tests all the word locations of said memory means.

29. An integrated circuit as recited in claim 28,
wherein said integrated circuit further comprises fault locating means for locating one or more faults in at least one of said memory means, said data buffer means, said address buffer means and said address decoder means.

30. An integrated circuit as recited in claim 28, wherein said address buffer means further functions as a binary counter to identify a state of testing for each of the word locations and to automatically increment the address to allow the next word location to be tested.

31. A method of testing an integrated circuit when placed in a self-test mode, the integrated circuit comprising a memory including a plurality of word locations; an address buffer, including address lines connected to address inputs of the memory; a data buffer, including data lines connected to the memory; and test circuitry, coupled between the memory and the data buffer, said method of testing the integrated circuit comprising the steps of:

(a) enabling the self-test mode of the integrated circuit;
(b) providing the integrated circuity with an initial test value for testing the integrated circuit, and storing the initial test value as input test data in the test circuitry;
(c) causing the test circuitry to invert a bit of the input test data prior to testing each word location to generate a unique word value in a manner that will detect faults contained within the address buffer, address lines, data buffer, data lines, and word locations of the memory;
(d) transferring the unique word value from the test circuitry to a first word location of the memory to test one or more bits of said first word location;
(e) transferring output test data from the first word location of the memory to the test circuitry;
(f) causing the test circuitry to rotate the output test data by at least one bit position prior to testing the remaining bits of each word location of said memory;
(g) repeating steps (d)–(f) a number of times equal to the word length in bits;
(h) causing the address buffer to address a next word location of the memory;
(i) repeating steps (c)–(h) a predetermined number of times using the rotated output test data as the input test data in order to test each bit of each word location of the memory; and
(j) testing the output test data of the final word location of the memory to be tested to determine whether a fault is present within the address buffer, address lines, data buffer, data lines, and word locations of the memory of the integrated circuit, wherein each word location is tested with test data that is unique compared to the test data used to test each of the other word locations of the memory.

32. The method as recited in claim 31, further comprising the step of testing the output test data after each word location has been tested in order to determine whether a fault is present and the location of the fault within the integrated circuit.

33. The method as recited in claim 32, wherein step (g) comprises the step of causing the address buffer to address the next successive word location in the memory.

* * * * *

UNITED STATES PATENT AND TRADEMARK OFFICE
CERTIFICATE OF CORRECTION

PATENT NO. : 5,537,632
DATED : July 16, 1996
INVENTOR(S) : Steven S. GORSHE

It is certified that error appears in the above-indentified patent and that said Letters Patent is hereby corrected as shown below:

Column 8, line 55, TABLE 3, Row i, numbered column 6, delete "1" and insert -- 0 --.

Signed and Sealed this

Twelfth Day of November, 1996

Attest:

BRUCE LEHMAN

Attesting Officer

Commissioner of Patents and Trademarks